United States Patent [19]
Kitamura

[11] Patent Number: 5,250,816
[45] Date of Patent: Oct. 5, 1993

[54] MULTICHIP SYSTEM AND METHOD OF SUPPLYING CLOCK SIGNAL THEREFOR

[75] Inventor: Kazuo Kitamura, Itami, Japan

[73] Assignee: Mitsubishi Denki Kabushiki Kaisha, Tokyo, Japan

[21] Appl. No.: 824,982

[22] Filed: Jan. 24, 1992

[30] Foreign Application Priority Data

Apr. 8, 1991 [JP] Japan .................. 3-074858
Apr. 18, 1991 [JP] Japan .................. 3-086834

[51] Int. Cl.⁵ .................................. H01L 27/14
[52] U.S. Cl. .................................. 257/81; 257/82; 257/84; 257/98; 257/432; 385/49; 307/311
[58] Field of Search ............ 257/80, 81, 82, 98, 257/99, 100, 432, 84, 85, 433, 434; 385/49; 307/311

[56] References Cited

U.S. PATENT DOCUMENTS

| | | | |
|---|---|---|---|
| 3,631,251 | 12/1971 | LeHovec | 257/82 X |
| 4,675,624 | 6/1987 | Rosen et al. | 257/82 X |
| 4,890,895 | 1/1990 | Zauracky et al. | 350/96.20 |
| 4,899,204 | 2/1990 | Rosen et al. | 257/82 X |
| 4,961,616 | 10/1990 | Tada . | |
| 5,093,879 | 3/1992 | Bregman et al. | 257/80 X |

FOREIGN PATENT DOCUMENTS

| | | |
|---|---|---|
| 0033631 | 8/1981 | European Pat. Off. . |
| 0159832 | 10/1985 | European Pat. Off. . |
| 0335104 | 10/1989 | European Pat. Off. . |
| 8503179 | 7/1985 | PCT Int'l Appl. . |

OTHER PUBLICATIONS

Hartman, "Digital High Speed Interconnects: A Study of the Optical Alternative," *Optical Engineering*, vol. 25, No. 10, Oct. 1986, pp. 1086-1102.

Clymer et al., "Optical Clock Distribution To Silicon Chips", *Optical Engineering*, vol. 25, No. 10, Oct. 1986, pp. 1103-1108.

Balliet et al., "Optical Transmission System For Interconnecting Electronic Units," *IBM Technical Disclosure Bulletin*, vol. 28, No. 4, Sep. 1983, pp. 1793-1796.

Optical Engineering, vol. 25, No. 10, Oct. 1986, pp. 1109-1118, L. A. Bergman, et al., "Holographic Optical Interconnects for VLSI".

*Primary Examiner*—William Mintel
*Attorney, Agent, or Firm*—Oblon, Spivak, McCelland, Maier & Neustadt

[57] ABSTRACT

A light emitting unit blinks based on a clock signal from a clock signal supply unit, whereby the clock signal (electric signal) is transformed into a light signal. The light signal is directed toward a plurality of semiconductor chips each of which has an internal circuit and a photodetector. The photodetectors receive the light signal, transforms the light signal back into an electric signal, and supplies the electric signal as a clock signal to the internal circuits. Thus, clock skew caused by the impedance of aluminum wires is eliminated, so that the periods of signal transmission time for supplying the clock signal to the respective semiconductor chips are approximately equal.

6 Claims, 11 Drawing Sheets

MULTICHIP SYSTEM AND METHOD OF SUPPLYING CLOCK SIGNAL THEREFOR

BACKGROUND OF THE INVENTION

1. Field of the Invention

The present invention relates to a multichip system in which a plurality of semiconductor chips are synchronously operated based on a clock signal from a clock signal supply unit, and to a method of supplying the clock signal therefor.

2. Description of the Background Art

FIG. 14 is a block diagram of a conventional multichip system. In the conventional multichip system, a plurality of semiconductor chips 1 are provided on a printed circuit board 2. Aluminum wires 3 on the printed circuit board 2 electrically connect the respective semiconductor chips 1 to a clock signal supply unit 4. Thus, all the semiconductor chips 1 are operated in synchronism with each other based on a clock signal $S_{CL}$ given from the clock signal supply unit 4 through the aluminum wires 3.

In the conventional multichip system, the aluminium wires 3 act as a transmission path for the clock signal $S_{CL}$. The lengths of the aluminum wires 3, i.e., transmission distances between the clock signal supply unit 4 and the semiconductor chips 1 are different from each other. Accordingly, periods of time required to transmit the clock signal $S_{CL}$ from the clock signal supply unit 4 to the respective semiconductor chips 1 (hereinafter referred to as "signal transmission time") are different depending on the transmission distance. In other words, clock skew occurs because of the different lengths of the aluminum wires 3. In particular, the impedance of the aluminum wires 3 increases as the frequency of the clock signal $S_{CL}$ grows higher. In this case, there has been a practically serious problem that the clock skew is resultingly aggravated as compared with the clock signal $S_{CL}$ having a low frequency.

SUMMARY OF THE INVENTION

The present invention is directed to a multichip system, (a) a clock signal supply unit for generating a clock signal, the clock signal being an electric signal; (b) a light emitting unit blinking in response to the clock signal from the clock signal supply unit, to thereby transform the clock signal into a light signal corresponding to the clock signal; and (c) a plurality of semiconductor chips each of which includes (c-1) a semiconductor element having an internal circuit, (c-2) a photodetector for transforming the light signal back into an electric signal, the photodetector being electrically connected to the internal circuit such that the electric signal is supplied to the internal circuit, the electric signal serving as a clock signal for the internal circuit, and (c-3) a light transmission unit for receiving the light signal from the light emitting unit to transmit the light signal to the photodetector.

The present invention is also directed to a method of supplying a clock signal for a multichip system, the multichip system including a plurality of semiconductor chips each of which has an internal circuit as function of the clock signal. The method comprises the steps of; generating the clock signal; transforming the clock signal into a light signal; transmitting the light signal to internal portions of the semiconductor chips to transform the light signal back into an electric signal; and supplying the electric signal to the internal circuits, whereby all of the internal circuits are synchronously operated based on the electric signal.

According to the present invention, the light emitting device blinks based on the clock signal from the clock signal supply unit, whereby the clock signal (electric signal) is transformed into the light signal. The photodetector included in the semiconductor chip receives the light from the light emitting device, transforms the light signal from the light emitting device into the electric signal, and supplies the signal as the clock signal to the internal circuit of the semiconductor chip. Clock skew caused by the impedance of aluminum wires is eliminated. The periods of signal transmission time for supplying the clock signal to the respective semiconductor chips are approximately equal.

Accordingly, an object of the present invention is to provide a multichip system capable of suppressing clock skew.

Another object of the present invention is to provide a method of supplying a clock signal capable of suppressing clock skew.

These and other objects, features, aspects and advantages of the present invention will become more apparent from the following detailed description of the present invention when taken in conjuction with the accompanying drawings.

DESCRIPTION OF THE PREFERRED EMBODIMENTS

Figure 1A:
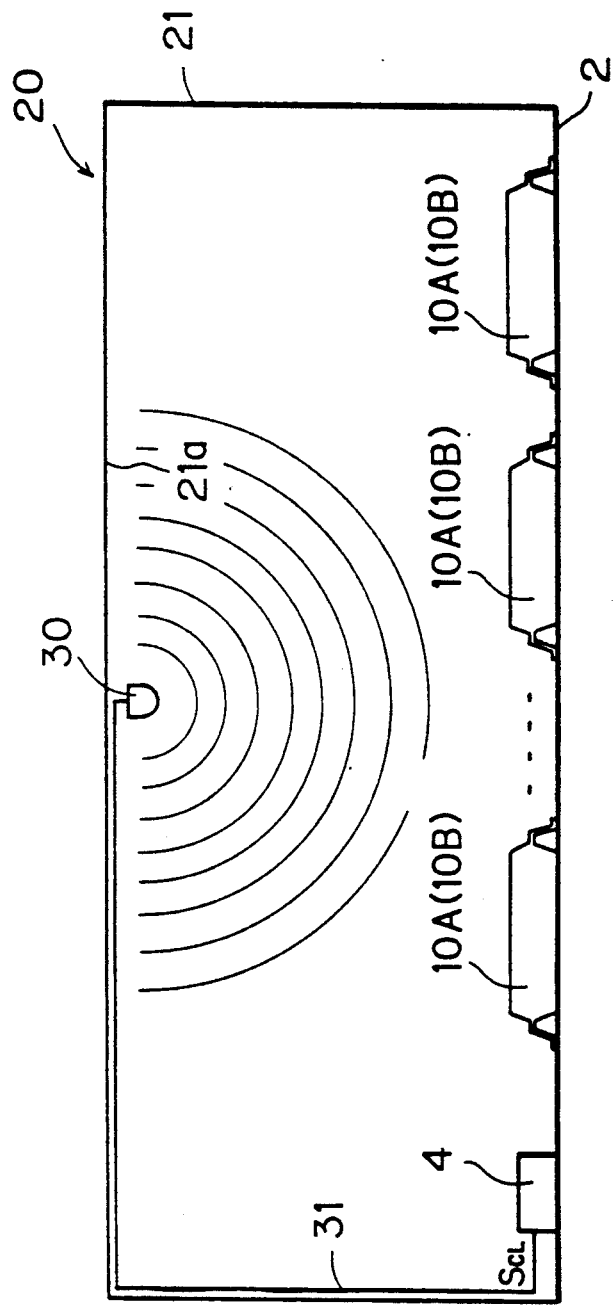
FIG. 1A shows a multichip system according to a first preferred embodiment of the present invention.

FIG. 1A shows a multichip system according to a first preferred embodiment of the present invention. A plurality of semiconductor chips 10A and a clock signal supply unit 4 are mounted on a printed circuit board 2. A case member 21 is installed on the printed circuit board 2 such that it encloses the semiconductor chips 10A and the clock signal supply unit 4, whereby an IC housing box 20 is formed. The clock signal supply unit 4, which is composed of a single semiconductor chip or a plurality of circuit components, outputs a clock signal $S_{CL}$ for synchronously operating internal circuits (not shown) of the semiconductor chips 10A.

An LED (light emitting diode) 30 is fitted to an inner peripheral face 21a of the IC housing box 20, the face 21a directed toward the printed circuit board 2. When the clock signal (electric signal) $S_{CL}$ is transmitted from the clock signal supply unit 4 through a conductor 31 to the LED 30, the LED 30 blinks in response to the clock signal. The clock signal (electric signal) $S_{CL}$ from the clock signal supply unit 4 is thus transformed into a light signal.

Figure 2:
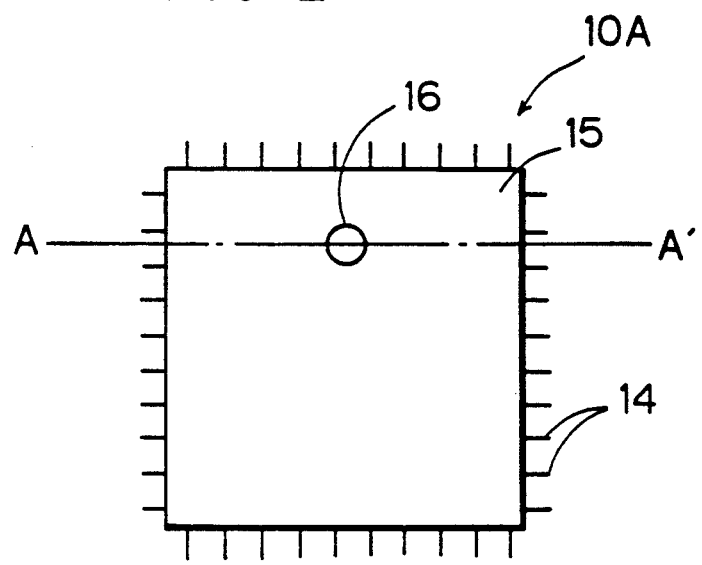
FIG. 2 is a top plan view of a semiconductor chip.
Figure 3:
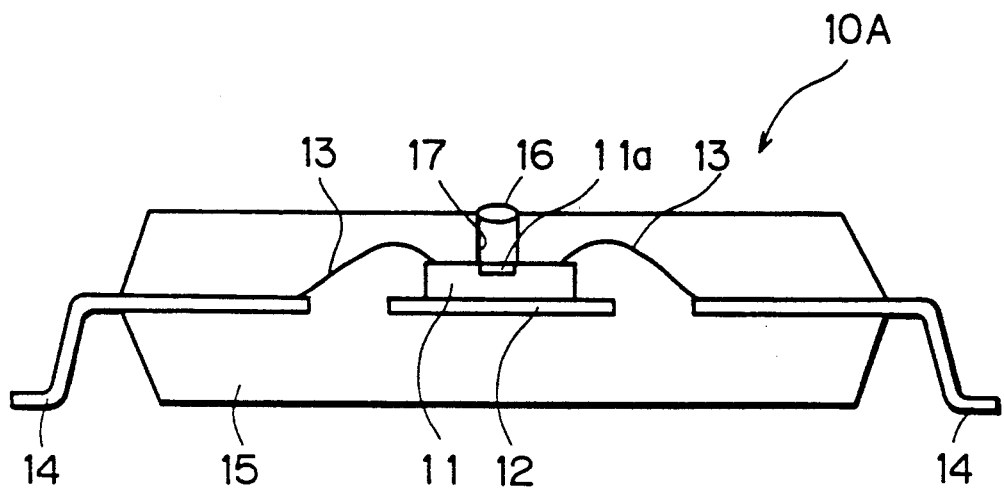
FIG. 3 is a cross-sectional view taken along the line A—A' of FIG. 2.

FIG. 2 is a top plan view of the semiconductor chip 10A, and FIG. 3 is a cross-sectional view taken along the line A—A' of FIG. 2. In the semiconductor chip 10A, a semiconductor element 11 including the internal circuit is mounted on a die bonding pad 12 and is electrically connected to leads 14 through Au wires 13. The semiconductor element 11, the die pad 12, the Au wires 13, and parts of the leads 14 are sealed in a mold resin 15. An optical element for introducing light coming from above into the semiconductor chip 10A, e.g., a lens 16 is fitted to the top face of the semiconductor chip 10A. The light passing through the lens 16 is adapted to be introduced through a hollow 17 to a photodetector 11a provided on an upper portion of the semiconductor element 11. The lens 16 and the hollow 17 serve as light transmission means for transmitting the light signal from the LED 30 to the interior of the semiconductor chip 10A. In each of the semiconductor chips 10A, the light signal emitted from the LED 30 in response to the clock signal $S_{CL}$ enters the photodetector 11a through the lens 16 and hollow 17 and is transformed back into a clock signal (electric signal). The clock signal from the clock signal supply unit 4 is thus supplied to the internal circuit of the semiconductor element 11. The hollow 17 may be replaced with an optical fiber through which the light passing through the lens 16 enters the photodetector 11a.

In the first preferred embodiment, the LED 30 (light emitting diode) transforms the clock signal (electric signal) $S_{CL}$ into the light signal, and the photodetectors 11a of the respective semiconductor chips 10A transform the light signal back into the electric signal. The electric signal is supplied to the internal circuits of the semiconductor devices 11 as the clock signal, so that the respective semiconductor chips 10A are operated in synchronism with each other. Hence, clock skew resulting from the impedance of aluminium wires is eliminated. The periods of signal transmission time, for transmitting the clock signal $S_{CL}$ from the clock signal supply unit 4 to the respective semiconductor chips 10A, are approximately equal.

Figure 4:
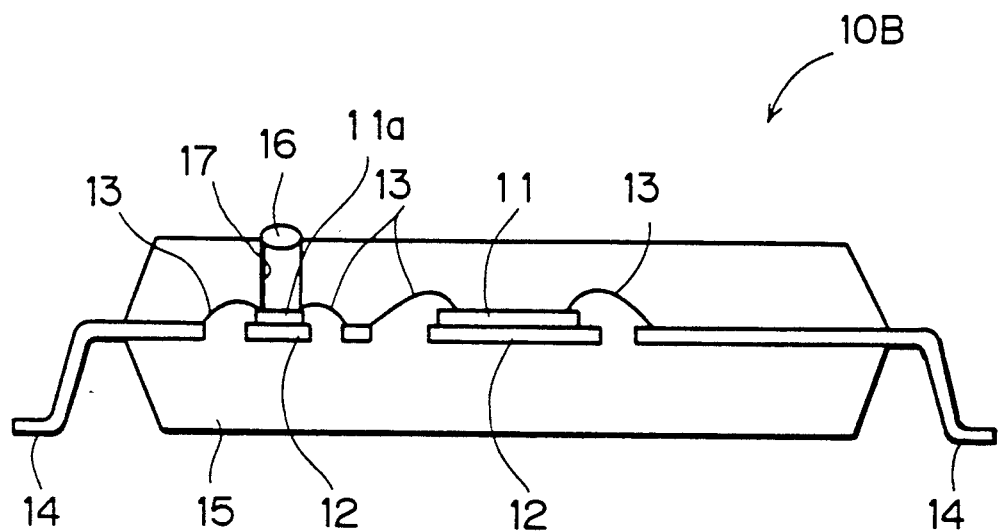
FIG. 4 is a cross-sectional view of the semiconductor chip.

The first preferred embodiment employs the semiconductor chip 10A in which the photodetector 11a and the semiconductor element 11 are formed integrally. A semiconductor chip 10B of FIG. 4, however, may be employed. The semiconductor chip 10B comprises a semiconductor element 11 and a photodetector 11a which are separately formed and which are then connected to each other within the same package.

Figure 1B:
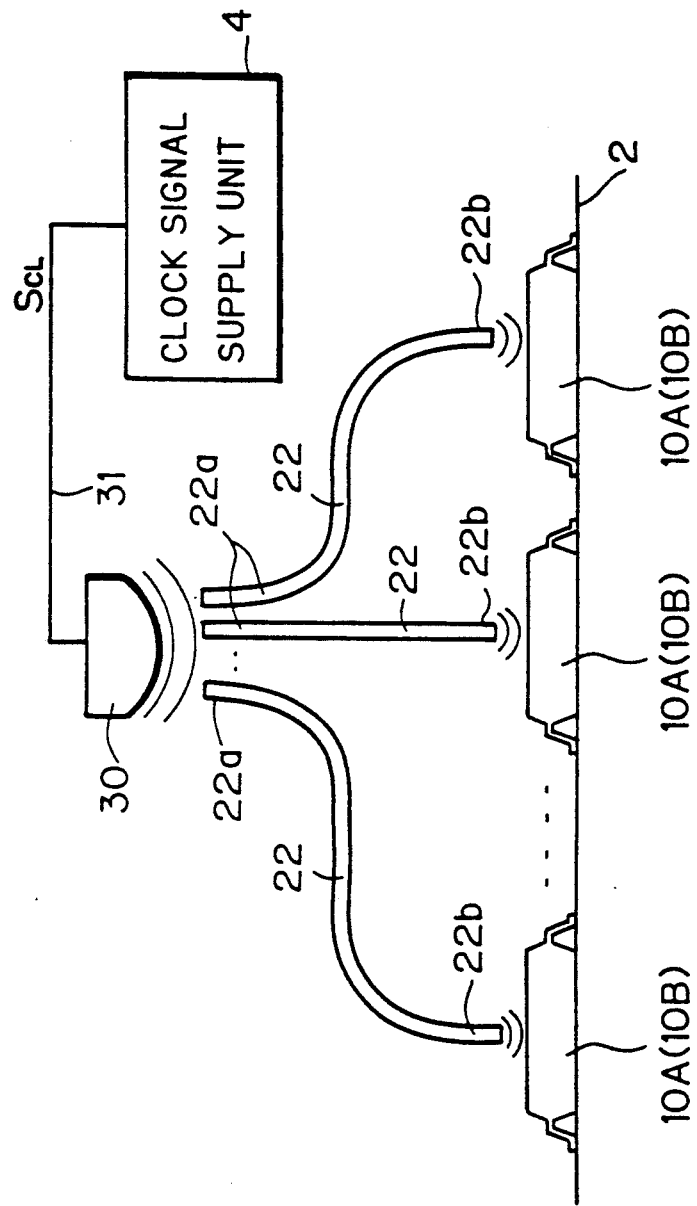
FIG. 1B shows a modification of the multichip system according to the first preferred embodiment.

As shown in FIG. 1B, it is also applicable to make optical connections between the LED 30 and the respective semiconductor chips 10A (or 10B) through optical fibers 22 serving as a light transmission path. When the light signal from the LED 30 enters inlet ends 22a of the optical fibers 22, the light signal is transmitted through the optical fibers 22 and is emitted from outlet ends 22b thereof toward the top faces of the semiconductor chips 10A.

Figure 5A:
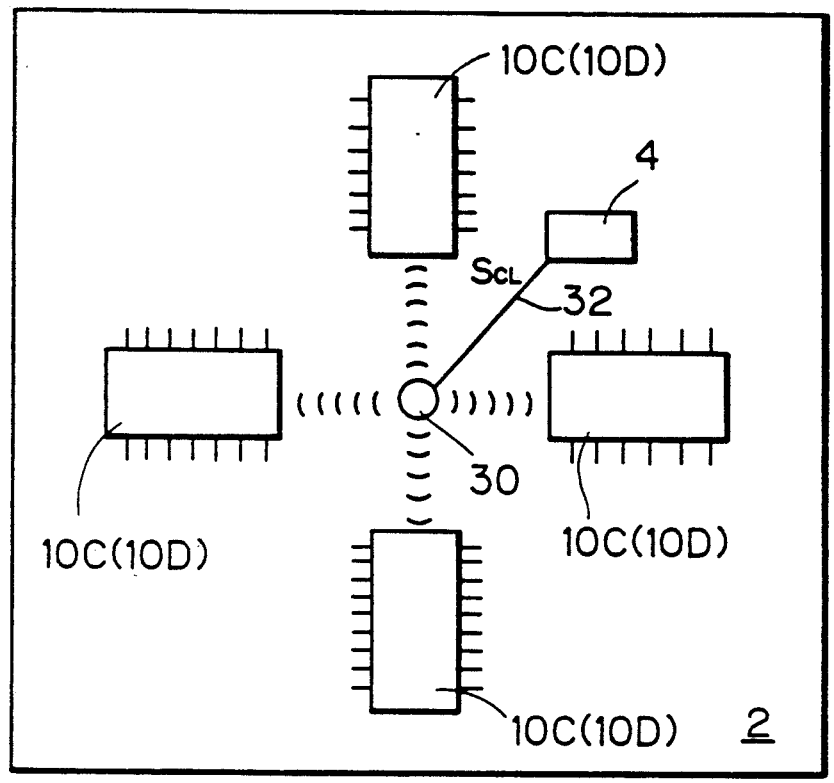
FIG. 5A shows the multichip system according to a second preferred embodiment of the present invention.

FIG. 5A shows the multichip system according to a second preferred embodiment of the present invention. In this multichip system, the LED 30 provided on a center portion of the printed circuit board 2 is electrically connected to the clock signal supply unit 4 mounted on the printed circuit board 2 through a printed wiring 32. When the clock signal (electric signal) $S_{CL}$ is transmitted from the clock signal supply unit 4 through the printed wiring 32 to the LED 30, the LED 30 blinks in response to the clock signal $S_{CL}$, so that the light signal responsive to the clock signal $S_{CL}$ is emitted radially.

Figure 6:
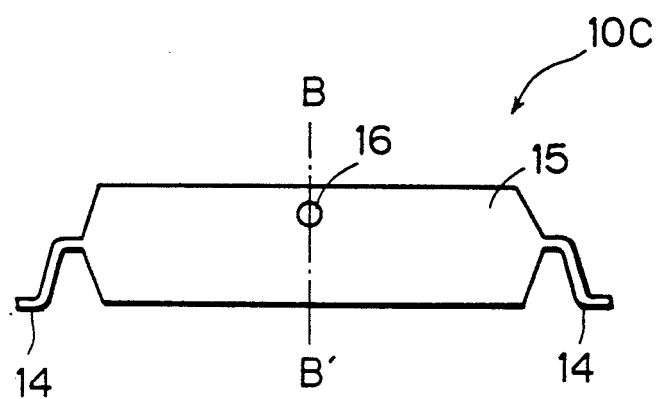
FIG. 6 is a front elevation of the semiconductor chip.
Figure 7:
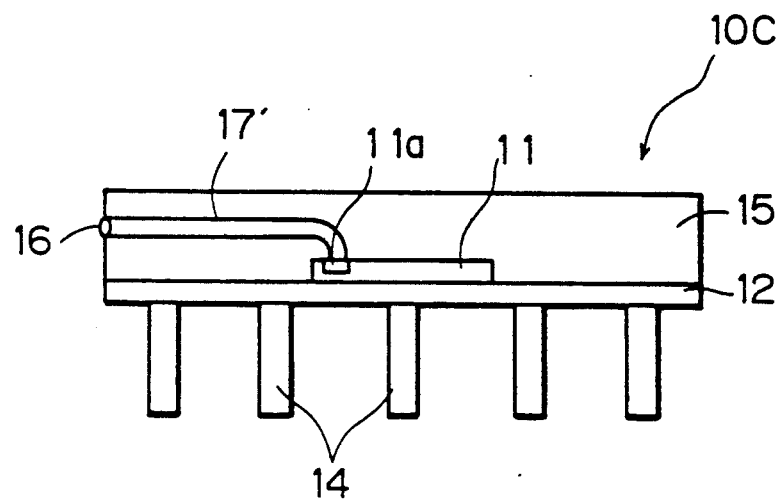
FIG. 7 is a cross-sectional view taken along the line B—B' of FIG. 6.

On the printed circuit board 2, there are provided a plurality of semiconductor chips 10C radially around the LED 30 such that the lenses 16 described later face the LED 30. FIG. 6 is a front elevation of the semiconductor chip 10C, and FIG. 7 is a cross-sectional view taken along the line B—B' of FIG. 6. The semiconductor chip 10C has substantially the same structure as the semiconductor chip 10A of FIG. 3 except the following difference: In the semiconductor chip 10A of FIG. 3, the lens 16 serving as the optical element for receiving the external light signal is mounted on the top face thereof. In the semiconductor chip 10C of FIGS. 6 and 7, on the other hand, the lens 16 is mounted on a side face thereof. Referring to FIG. 7, the lens 16 serves as the light transmission means in cooperation with an optical fiber 17'. The light passing through the lens 16 enters the photodetector 11a of the semiconductor element 11 through the optical fiber 17'. In each of the semiconductor chips 10C, the light signal emitted from the LED 30 in response to the clock signal $S_{CL}$ enters the photodetector 11a and is transformed back into the clock signal (electric signal). The clock signal is supplied to the internal circuit (not shown) of the semiconductor element 11. The lens 16 may be replaced with a transparent plate.

In the second preferred embodiment, the light signal from the LED 30, corresponding to the clock signal output from the clock signal supply unit 4, is transmitted to the respective semiconductor chips 10C and is transformed back into the electric signal. Thereafter, the transformed electric signal is supplied to the internal circuits of the semiconductor devices 11 as the clock signal. Hence, the second preferred embodiment has the effects similar to the first preferred embodiment.

Figure 8:
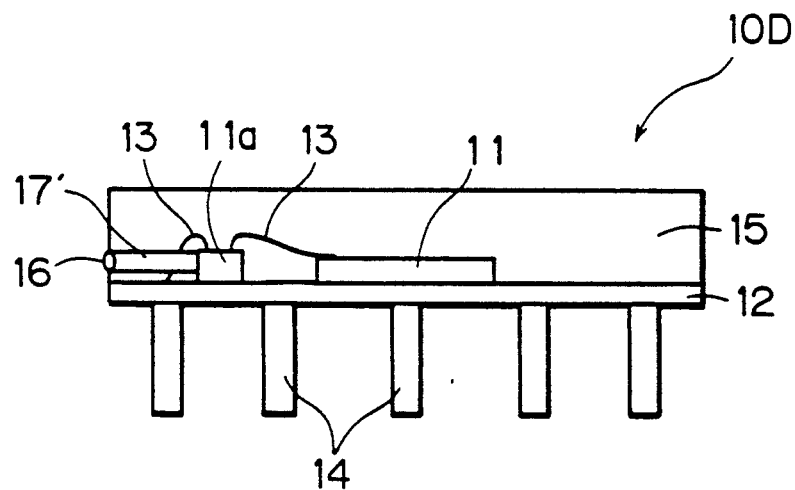
FIG. 8 is a cross-sectional view of the semiconductor chip.

The second preferred embodiment employs the semiconductor chip 10C in which the photodetector 11a and the semiconductor element 11 are formed integrally. A semiconductor chip 10D of FIG. 8, however, may be employed which is comprised of a semiconductor element 11 and a photodetector 11a separately formed. In this case, the light passing through the lens 16 is adapted to enter the photodetector 11a through the optical fiber 17' or through the hollow.

Figure 5B:
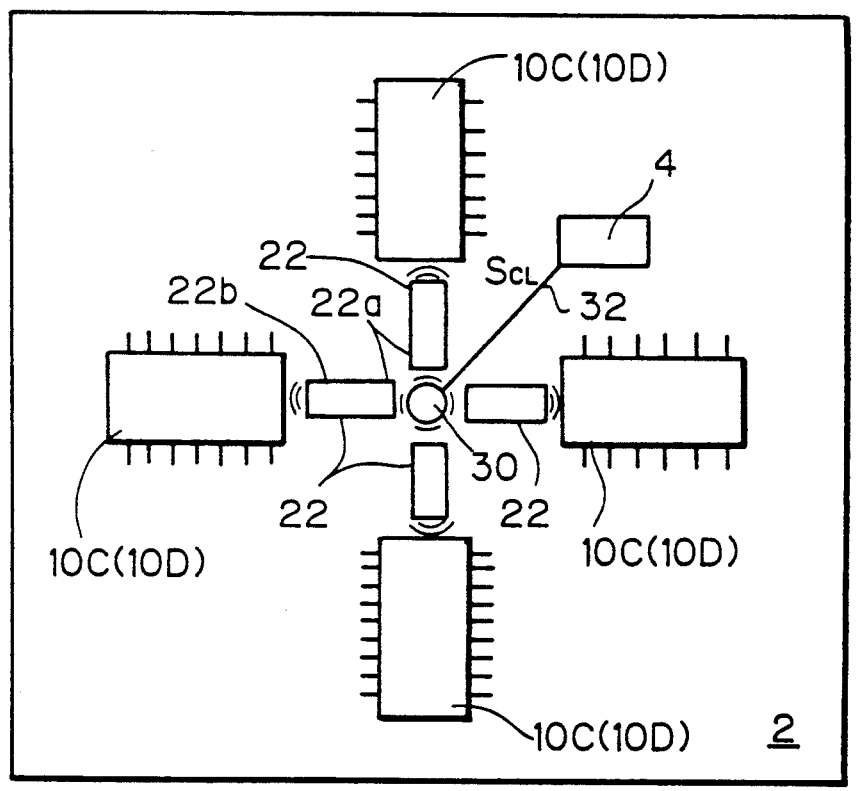
FIG. 5B shows a modification of the multichip system according to the second preferred embodiment.

As shown in FIG. 5B, it is also applicable to make optical connections between the LED 30 and the respective semiconductor chips 10C (or 10D) through the optical fibers 22. The light signal from the LED 30 is directly applied to the lenses 16 fitted to the side faces of the respective semiconductor chips 10C (or 10D) through the optical fibers 22.

Figure 9:
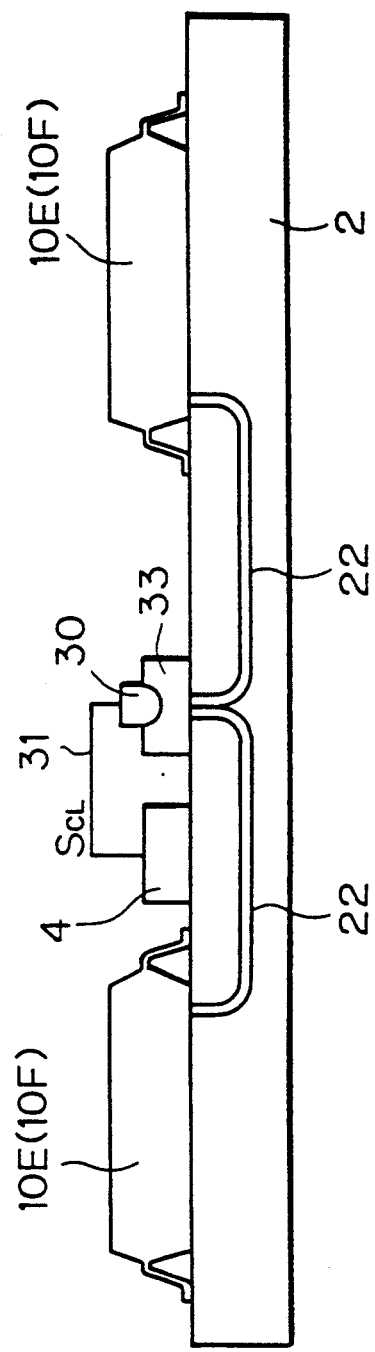
FIG. 9 shows the multichip system according to a third preferred embodiment of the present invention.

FIG. 9 shows the multichip system according to a third preferred embodiment of the present invention. In this multichip system, the LED 30, fixed to the printed circuit board 2 by a LED supporting member 33, is electrically connected to the clock signal supply unit 4 mounted on the printed circuit board 2 through the conductor 31. When the clock signal (electric signal) $S_{CL}$ is applied from the clock signal supply unit 4 through the conductor 31 to the LED 30, the LED 30 blinks in response to the clock signal $S_{CL}$, to thereby generate a light signal corresponding to the clock signal $S_{CL}$. The light signal is emitted toward the surface of the printed circuit board 2. A plurality of optical fibers 22 are buried in the printed circuit board 2. The light signal from the LED 30 is transmitted to predetermined positions by the optical fibers 22 and, thereafter, is emitted upwardly from the surface of the printed circuit board 2.

Figure 10:
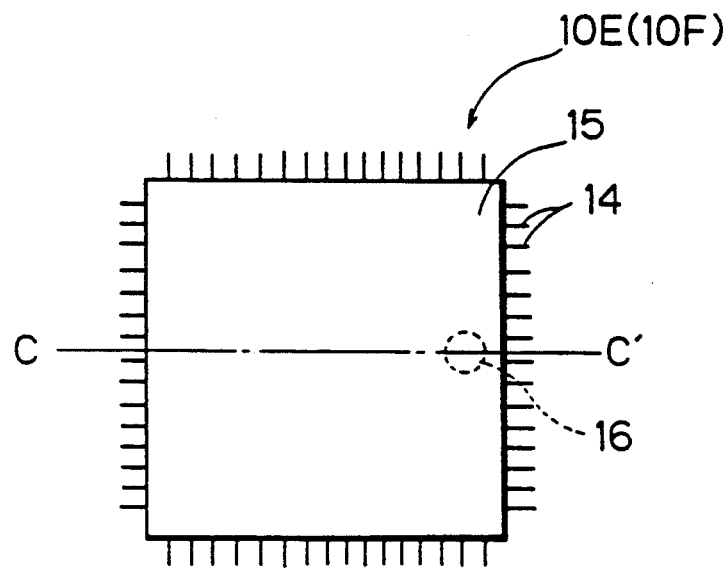
FIG. 10 is a top plan view of the semiconductor chip.
Figure 11:
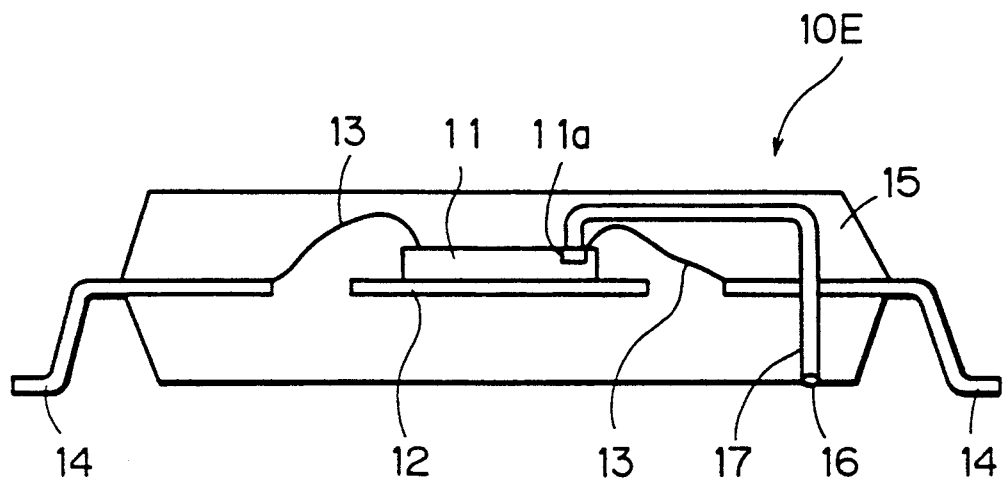
FIG. 11 is a cross-sectional view taken along the line C—C' of FIG. 10.

A plurality of semiconductor chips 10E are mounted on the printed circuit board 2 such that the lenses 16 described later are in the positions of the outlet ends of the optical fibers 22. FIG. 10 is a top plan view of the semiconductor chip 10E, and FIG. 11 is a cross-sectional view taken along the line C—C' of FIG. 10. The semiconductor chip 10E has substantially the same structure as the semiconductor chip 10A of FIG. 3 except the following difference: In the semiconductor chip 10A of FIG. 3, the lens 16 serving as the optical element for receiving the external light signal is mounted on the top face of the chip. In the semiconductor chip 10E of FIGS. 10 and 11, on the other hand, the lens 16 is mounted on the bottom face of the chip. The lens 16 and the optical fiber 17' cooperate to light transmission means for transmitting the external light signal to the semiconductor element 11, as shown in FIG. 11: more precisely, the light passing through the lens 16 is transmitted through the optical fiber 17' to the photodetector 11a of the semiconductor element 11. The light signal is transformed back into the clock signal (electric signal). The clock signal is supplied to the internal circuit (not shown) of the semiconductor element 11. The lens 16 may be replaced with the transparent plate.

Similarly to the first and second preferred embodiments, the LED 30 (light emitting device) transforms the clock signal (electric signal) $S_{CL}$ into the light signal, and the photodetectors 11a of the respective semiconductor chips 10E transform the light signal back into the electric signal, in the third preferred embodiment. The transformed electric signal is, as the clock signal, supplied to the internal circuits of the semiconductor devices 11. The third preferred embodiment has the effects similar to the first preferred embodiment.

Figure 12:
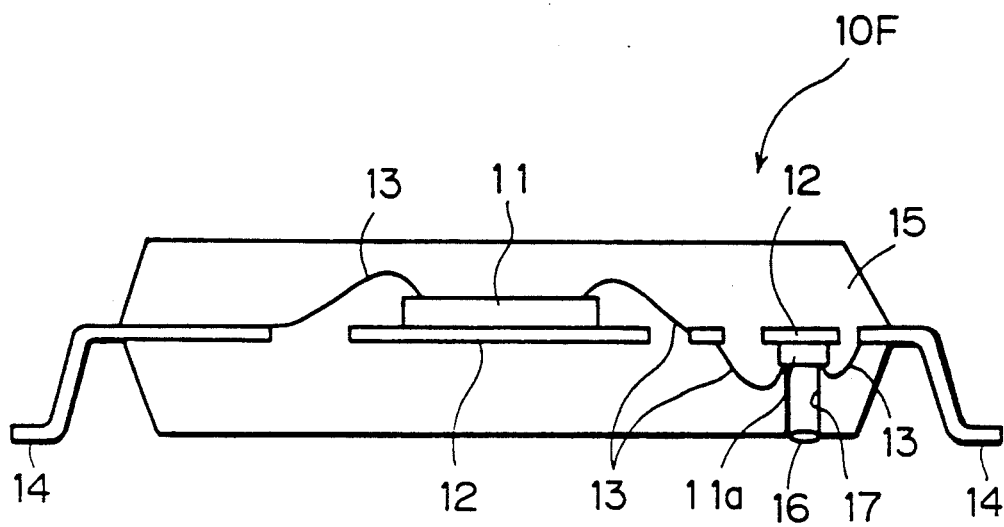
FIG. 12 is a cross-sectional view of the semiconductor chip.

The third preferred embodiment employs the semiconductor chip 10E in which the photodetector 11a and the semiconductor element 11 are formed integrally. A semiconductor chip 10F of FIG. 12, however, may be employed which includes two components (a semiconductor element 11 and a photodetector 11a) separately formed. In this case, the light passing through the lens 16 is adapted to enter the photodetector 11a through the optical fiber 17 or through the hollow.

Figure 13:
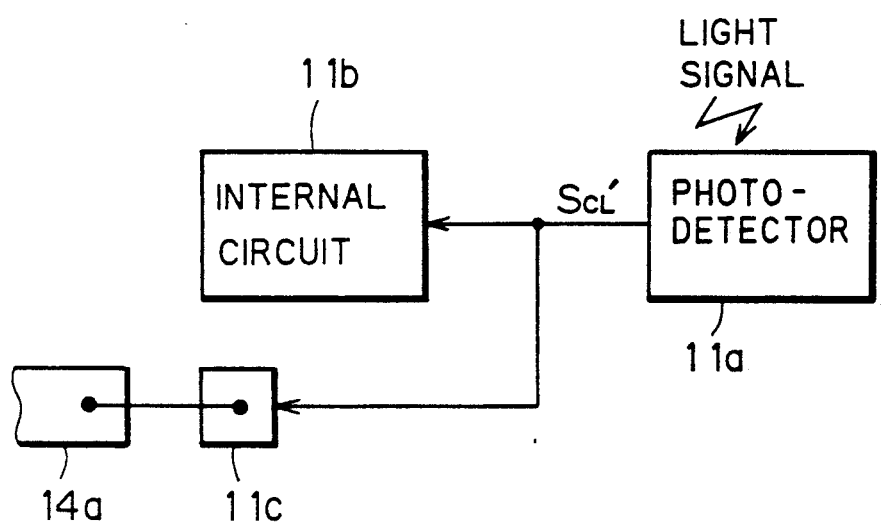
FIG. 13 illustrates a method of monitoring a clock signal.
Figure 14:
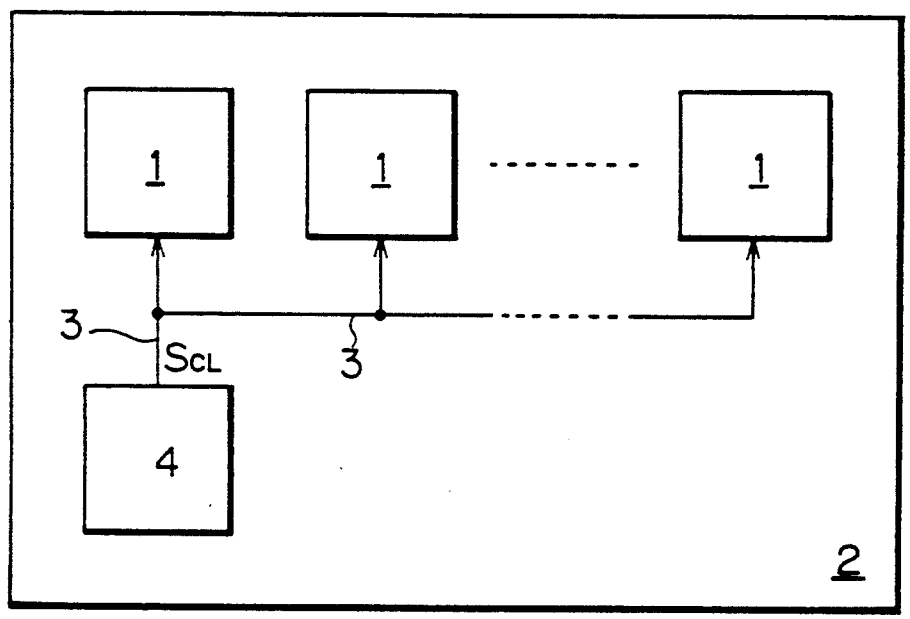
FIG. 14 is a block diagram of a conventional multichip system.

The provision of a lead 14a in the semiconductor chip enables a clock signal $S_{CL}'$, supplied to an internal circuit 11b of the semiconductor element 11, to be monitored. As in FIG. 13, the semiconductor element 11 is equipped with a bonding pad 11c for monitoring. The signal $S_{CL}'$ from the photodetector 11a is applied not only to the internal circuit 11b of the semiconductor element 11 but also to the bonding pad 11c. Hence, the clock signal $S_{CL}'$ can be monitored through the Au wires 13 and the lead 14a.

The first to third preferred embodiments employ the lens 16 as the optical element. The lens 16 may be replaced with the transparent plate.

While the invention has been shown and described in detail, the foregoing description is in all aspects illustrative and not restrictive. It is therefore understood that numerous modifications and variations can be devised without departing from the scope of the invention.

I claim:

1. A multichip system, comprising;
  (a) a clock signal supply unit for generating a clock signal, said clock signal being an electric signal;
  (b) a light emitting unit blinking in response to said clock signal from said clock signal supply unit, to thereby transform said clock signal into a light signal corresponding to said clock signal; and
  (c) a plurality of semiconductor chips each of which includes
    (c-1) a semiconductor element having an internal circuit,
    (c-2) a photodetector for transforming said light signal back into an electric signal, said photodetector being electrically connected to said internal circuit such that said electric signal is supplied to said internal circuit, said electric signal serving as a clock signal for said internal circuit, and
    (c-3) a light transmission unit for receiving said light signal from said light emitting unit to transmit said light signal to said photodetector, including an optical element and a hollow, said optical element being fitted on a side surface of said semiconductor chip, said hollow being provided in an internal portion of said semiconductor chip such that said light signal from said light emitting unit passes through said optical element and impinges through said hollow upon said photodetector.

2. A multichip system in accordance with claim 1, wherein said semiconductor chips are provided radially around said light emitting unit such that said optical element faces said light emitting unit.

3. A method of supplying a clock signal for a multichip system, said multichip system including a plurality of semiconductor chips each of which has an internal circuit as a function of said clock signal, said method comprising the steps of:
  generating said clock signal;
  transforming said clock signal into a light signal;
  transmitting said light signal to internal portions of said semiconductor chips to transform said light signal back into an electric signal; and
  supplying said electric signal to said internal circuits and at the same time as an output from said semiconductor chips, whereby all of said internal circuits are synchronously operated based on said electric signal.

4. A multichip system, comprising;
  (a) a clock signal supply unit for generating a clock signal, said clock signal being an electric signal;
  (b) a light emitting unit blinking in response to said clock signal from said clock signal supply unit, to thereby transform said clock signal into a light signal corresponding to said clock signal; and
  (c) a plurality of semiconductor chips each of which includes (c-1) a semiconductor element having an internal circuit, (c-2) a photodetector for transforming said light signal back into an electric signal, said photodetector being electrically connected to said internal circuit such that said electric signal is supplied to said internal circuit, said electric signal serving as a clock signal for said internal circuit, and (c-3) a light transmission unit for receiving said light signal from said light emitting unit to transmit said light signal to said photodetector, including an optical element and a second optical fiber, said optical element being fitted on a side face of said semiconductor chip, said second optical fiber being provided in an internal portion of said semiconductor chip such that said light signal from said light emitting unit passes through said optical element and impinges on said photodetector.

5. A multichip system in accordance with claim 4, wherein said semiconductor chips are provided radially around said light emitting unit such that said optical element faces said light emitting unit.

6. A multichip system, comprising;

(a) a clock signal supply unit for generating a clock signal, said clock signal being an electric signal;

(b) a light emitting unit blinking in response to said clock signal from said clock signal supply unit, to thereby transform said clock signal into a light signal corresponding to said clock signal; and (c) a plurality of semiconductor chips each of which includes (c-1) a semiconductor element having an internal circuit, (c-2) a photodetector for transforming said light signal back into an electric signal, said photodetector being electrically connected to said internal circuit such that said electric signal is supplied to said internal circuit, said electric signal serving as a clock signal for said internal circuit, (c-3) a light transmission unit for receiving said light signal from said light emitting unit to transmit said light signal to said photodetector, and (c-4) a lead terminal, said lead terminal being electrically connected to said photodetector such that said electric signal supplied to said internal circuit is also supplied as an output.

* * * * *